(12) United States Patent
Yamaguchi et al.

(10) Patent No.: US 7,306,990 B2
(45) Date of Patent: Dec. 11, 2007

(54) INFORMATION STORAGE ELEMENT, MANUFACTURING METHOD THEREOF, AND MEMORY ARRAY

(75) Inventors: Shinya Yamaguchi, Tokyo (JP); Masahiko Ando, Ibaraki (JP); Toshikazu Shimada, Tokyo (JP); Natsuki Yokoyama, Tokyo (JP); Shunri Oda, Tokyo (JP); Nobuyoshi Koshida, Tokyo (JP)

(73) Assignee: Japan Science & Technology Agency, Saitama (JP)

( * ) Notice: Subject to any disclaimer, the term of this patent is extended or adjusted under 35 U.S.C. 154(b) by 374 days.

(21) Appl. No.: 10/535,941

(22) PCT Filed: Nov. 28, 2003

(86) PCT No.: PCT/JP03/15292

§ 371 (c)(1),
(2), (4) Date: May 24, 2005

(87) PCT Pub. No.: WO2004/051751
PCT Pub. Date: Jun. 17, 2004

(65) Prior Publication Data
US 2006/0051920 A1  Mar. 9, 2006

(30) Foreign Application Priority Data
Nov. 29, 2002 (JP) .............................. 2002-349249

(51) Int. Cl.
*H01L 21/336* (2006.01)
*H01L 21/00* (2006.01)
*H01L 29/788* (2006.01)
*H01L 21/3205* (2006.01)
*H01L 21/4763* (2006.01)
*H01L 29/76* (2006.01)

(52) U.S. Cl. .................. 438/257; 438/52; 438/258; 438/266; 438/587; 438/588; 257/E21.621; 257/E21.622; 257/E21.623; 257/E21.624; 257/321; 257/320; 257/316; 257/548; 257/331

(58) Field of Classification Search .................. 438/52, 438/459, 258, 257, 267, 266, 587, 588, 593; 257/321, 320, 316, 314, 548, 331, E21.176, 257/E21.186, E21.374, E21.458, E21.621, 257/E21.622, E21.623, E21.624, E21.635, 257/E21.636, E21.637, E21.638
See application file for complete search history.

(56) References Cited

U.S. PATENT DOCUMENTS 4,577,215 A * 3/1986 Stewart et al. ............... 257/319

(Continued)

FOREIGN PATENT DOCUMENTS

DE 2736734 A * 3/1978

(Continued)

OTHER PUBLICATIONS

J. Weckesser et al.; "Mesoscopic Correlation of Supramolecular Chirality in One-Dimensional Hydrogen-Bonded Assemblies", Physical Review Letters, vol. 87, No. 9, Aug. 27, 2001, pp. 096101-1 to 096101-4. (Discussed in the specification).

(Continued)

*Primary Examiner*—Walter Lindsay, Jr.
(74) *Attorney, Agent, or Firm*—Westerman, Hattori, Daniels & Adrian, LLP.

(57) ABSTRACT

An information memory device capable of reading and writing of information by mechanical operation of a floating gate layer, in which a gate insulation film has a cavity (6), and a floating gate layer (5) having two stable deflection states in the cavity (6), the state stabilized by deflecting toward the channel side of transistor, and the state stabilized by deflecting toward the gate (7) side, writing and reading of information can be made by changing the stable deflection state of the floating gate layer (5) by Coulomb interactive force between the electrons (or positive holes 8) accumulated in the floating gate layer (5) and external electric field, and by reading the channel current change based on the state of the floating gate layer (5).

16 Claims, 9 Drawing Sheets

U.S. PATENT DOCUMENTS

| | | | |
|---|---|---|---|
| 4,811,078 A * | 3/1989 | Tigelaar et al. | 257/311 |
| 4,931,411 A * | 6/1990 | Tigelaar et al. | 438/201 |
| 5,266,509 A * | 11/1993 | Chen | 438/261 |
| 5,427,968 A * | 6/1995 | Hong | 438/264 |
| 5,482,879 A * | 1/1996 | Hong | 438/264 |
| 5,946,549 A * | 8/1999 | Itoigawa et al. | 438/53 |
| 6,069,392 A * | 5/2000 | Tai et al. | 257/419 |
| 6,146,543 A * | 11/2000 | Tai et al. | 216/2 |
| 6,194,272 B1 * | 2/2001 | Sung | 438/266 |
| 6,225,162 B1 * | 5/2001 | Lin et al. | 438/261 |
| 7,161,218 B2 * | 1/2007 | Bertin et al. | 257/415 |
| 2003/0022463 A1 * | 1/2003 | Zheng | 438/459 |
| 2005/0056877 A1 * | 3/2005 | Rueckes et al. | 257/300 |
| 2005/0142747 A1 * | 6/2005 | Lee | 438/257 |
| 2005/0167734 A1 * | 8/2005 | She et al. | 257/321 |
| 2006/0022264 A1 * | 2/2006 | Mathew et al. | 257/331 |
| 2006/0051920 A1 * | 3/2006 | Yamaguchi et al. | 438/257 |
| 2006/0097306 A1 * | 5/2006 | Kim et al. | 257/315 |
| 2006/0131569 A1 * | 6/2006 | Choi et al. | 257/40 |
| 2006/0255395 A1 * | 11/2006 | Fujita et al. | 257/315 |
| 2007/0015303 A1 * | 1/2007 | Bertin et al. | 438/50 |
| 2007/0037350 A1 * | 2/2007 | Woo et al. | 438/257 |

FOREIGN PATENT DOCUMENTS

| | | | |
|---|---|---|---|
| EP | 383011 A * | 8/1990 | |
| EP | 429620 A * | 6/1991 | |
| JP | 7-308080 | 11/1995 | |
| JP | 9-213191 | 8/1997 | |
| JP | 10004149 A * | 1/1998 | |
| JP | 11-297931 | 10/1999 | |
| JP | 2000-31397 | 1/2000 | |

OTHER PUBLICATIONS

Terada Yasushi; Electronic Materials, Kogyo Chosakai, Apr. 1993, p. 32. (Discussed in the specification).

The Institute of Electronics, Information, and Communication Engineers, Nov. 30, 1984. (Discussed in the Specification).

* cited by examiner

FIG. 1

(a) Initializing state (b) off-state (c) on-state

| Physical Parameter / Material | SiO$_2$ |
|---|---|
| Linear Expansion Corfficient $\kappa$ [K$^{-1}$] | $8.0 \times 10^{-6}$ |
| Compressibility $\alpha$ [N$^{-1}$m$^2$] | $2.4 \times 10^{-11}$ |
| Density m [Kg/m$^3$] | $2.4 \times 10^{3}$ |

FIG. 4

| Device Parameter | Structure Example1 | Structure Example2 |
|---|---|---|
| Channel Length L [$\mu$m] | 1.0 | 0.1 |
| Channel Width W [$\mu$m] | 1.0 | 0.1 |
| Floating Gate Layer Thickness [$\mu$m] | 0.1 | 0.01 |
| Gate-Floating Gate Distance [$\mu$m] | 0.1 | 0.01 |
| Accumulated Carrier Concentration [cm$^{-3}$] | $1 \times 10^{20}$ | $1 \times 10^{20}$ |
| Gate Voltage Vg [V] | 20 | 20 |
| Floating Gate Layer Displacement $\Delta z$ [$\mu$m] | 0.035 | 0.0035 |
| Elastic Potential $\phi$ [J] | $3.5 \times 10^{-12}$ | $3.5 \times 10^{-15}$ |
| Floating Gate Layer Mass [Kg] | $2.4 \times 10^{-16}$ | $2.4 \times 10^{-19}$ |
| Accumulated Charge [C] | $1.6 \times 10^{-12}$ | $1.6 \times 10^{-15}$ |
| Read and Write Time [s] | $4.76 \times 10^{-10}$ | $4.76 \times 10^{-11}$ |
| Read and Write Operation Speed [GHz] | 2.1 | 21 |

INFORMATION STORAGE ELEMENT, MANUFACTURING METHOD THEREOF, AND MEMORY ARRAY

TECHNICAL FIELD

The present invention relates to a flash EEPROM (electrically erasable and programmable read only memory) type non-volatile memory device belonging to one of semiconductor memory devices, a method of manufacturing the same, and a memory array of using it, especially to an information memory device characterized in the part of reading and writing of information, which are done by mechanical state change of a floating gate layer.

BACKGROUND ART

Heretofore, a flash memory has been known as one of non-volatile memory devices. The memory cell of the flash memory has a structure comprising a floating gate formed on a substrate via a tunnel oxide film, and a control gate formed via a gate insulation film, which are laminated with each other. In an operation of the memory cell, upon writing, electrons (or positive holes) are injected from a drain of the memory cell to the floating gate by using a voltage difference between the control gate and the drain.

On the other hand, upon erasing, electrons (or positive holes) in the floating gate are released into the drain by using a controlled voltage difference between the control gate and the drain. Assuming a substrate as P type, and a source and a drain as n type, a channel of the memory cell becomes off state in case that the floating gate has electrons, and on state in case that it has no electron, so that it operates as a non-volatile memory.

As conventional flash memories, FLOTOX (floating-gate tunnel oxide) types and MNOS (metal nitride oxide semiconductor) type are known. FLOTOX type has a structure comprising a tunnel oxide film (first gate insulation film), a floating gate, an interlayer insulation film (second gate insulation film), and a control gate laminated on a channel formed on a surface of a semiconductor substrate, and accumulates electric charges in the floating gate or releases them into the channel by applying controlled voltage difference either to generate an accumulated state or an erased state, and carry out writing and reading of 1 bit information by using the accumulated state and the erased state. MNOS type has a structure comprising two layers of insulation film made of oxide film (silicon oxide film) and nitride film, and accumulates electric charges into the trap of interface of two films thereof.

Also in contrast to those electrical memory, there are a mechanical non-volatile memory, for example, using a mechanical pendulum and others, which is seemed to be technologically closest in the field of realizing mechanical memory to the present invention (for example, see Physical Review Letters, Vol. 87, p. 096101-1, 2001.).

General description of Electrical flash memories are described in various journals (for example, see Electronic Materials, Kogyo Chosakai, April, 1993, p. 32, or LSI Handbook, Ohmsha, edited by The Institute of Electronics, Information, and Communication Engineers, Nov. 30, 1984, p. 485.). However, in the above-mentioned electrical flash memories, the material existing between the floating gate and the drain, through which the electric current of writing flows, is deteriorated by the current, and the repetition of the writing causes the formation of leakage current path between the floating gate and the drain, thereby a restriction for the times capable of writing arises. That is, since the electrons or positive holes accumulated in the floating gate flow out through the leakage current path formed by the repetition, there is a problem to be solved that the repetition of writing causes the memory not to operate as a non-volatile memory.

The object of the present invention is to provide an information memory device capable of writing an information by mechanical operation of a floating gate layer, a method of manufacturing the same, and a memory array of using it, by which the above problem can be solved.

DISCLOSURE OF THE INVENTION

In order to achieve the object described above, the information memory device according to the present invention, in a semiconductor transistor having a semiconductor substrate, a source, a drain, a gate, and a gate insulation film, characterized in that, the gate insulation film has a cavity, and a floating gate layer in said cavity having two stable deflection states, the stable states deflecting toward the channel side and toward the gate side of said transistor, wherein an information is memorized by said two stable deflection states of the floating gate layer.

The information memory device of this makeup operates as described below. By applying an initializing voltage between the gate and the drain, electric charges are injected into the floating gate layer, as well as it is initialized to the one state of two stable deflection states of the floating gate layer. Next, in order to change the stable deflection state without changing the amount of injected charges of the floating gate, a writing voltage being lower than the initializing voltage is applied. By changing or not changing the stable deflection state of the floating gate by means of selecting the sign of writing voltage, it is possible to write an information in it. If the stable deflection state of floating gate is the deflection state deflecting toward the channel side, then influence of electric field of the charges to the channel is large, and if it is the state deflecting toward the gate side, then influence of electric field of the charges to the channel is small, so that a written information can be read out by detecting a magnitude of the current between source and drain.

For example, if the floating gate is firstly stabilized at the state deflecting toward the channel side, and the initializing voltage being positive at the drain and negative at the gate is applied, then holes are injected into the floating gate, and then the floating gate is stabilized as being deflected toward the gate side by the Coulomb interactive force between the injected hole charges and the electric field directing from the drain toward the gate. Next, if the writing voltage being negative at the drain and positive at the gate is applied, since the amount of injected holes of floating gate does not change, the floating gate is stabilized as being deflected toward the channel side by the Coulomb interactive force between the injected hole charges and the electric field directing from the gate toward the drain. Since the floating gate having hole charges approaches to the channel, a conductivity of the channel changes, then a magnitude of the current between the source and drain changes.

The gate insulation film of the information memory device of the present invention is preferably made of silicon oxide. The floating gate layer is preferably a silicon oxide layer containing crystalline silicon grains. According to this make-up, since the electron affinity and ionization energy of crystalline silicon are large, the injected charges in the floating gate layer are well stored, and are not changed by the writing voltage.

Also, the floating gate layer may have the structure to sandwich a polycrystal silicon thin film layer with silicon oxide layers. Also, the each thickness of the two silicon oxide layers sandwiching a polycrystal silicon thin film layer may be different each other. According to this make-up, the elastic modulus of the floating gate can be varied in the every deflective direction, so that, for example, the writing speed can be made higher. The floating gate layer instead of the above mentioned is preferably a laminated structure of a silicon oxide layer and silicon nitride layer. According to this make-up, since the electric charges are held at defect states of the interface between the silicon oxide layer and the silicon nitride layer, the injected charges of the floating gate are well stored, and are not changed by the writing voltage.

By the information memory device of above-mentioned make-up, since writing is done by the mechanical operation of the floating gate, such the deterioration of conventional flash memories can not occur, that materials constituting the current path between the floating gate and the drain, through which the current of writing flows, is deteriorated by the current thereof.

The method of manufacturing the information memory device according to the present invention is explained next. The method of manufacturing the information memory device according to the present invention, in a semiconductor transistor having a semiconductor substrate, a source, a drain, a gate, and a gate insulation film, for making a gate insulation film which has a cavity and a floating gate layer in said cavity having two stable deflection states, the stable states deflecting toward the channel side and toward the gate side of transistor, characterized in that it comprises the steps of: forming a first silicon oxide layer on a semiconductor substrate by high temperature process; forming a caving region for the cavity at the region corresponding to a channel of transistor by etching said first silicon oxide layer; leaving a silicon nitride layer in said caving region by forming a first silicon nitride layer on said surface and etching said silicon nitride layer; forming a floating gate layer by low temperature process the temperature of which is lower than the temperature of said high temperature process; leaving a silicon nitride layer on the region corresponding to said cavity region by forming a second silicon nitride layer on said surface and etching said second silicon nitride layer; forming a second silicon oxide layer on said surface by said high temperature process and etching a multi layer structure comprising said second silicon oxide layer, said floating gate layer, and said first silicon oxide layer into a shape of a gate insulation film; forming said cavity by removing said first and second silicon nitride layer from said structure etched into the shape of gate insulation film; and deflecting said floating gate by annealing said structure.

In the above-mentioned method, the process in which to form the first silicon oxide layer by high temperature process is preferably a thermal oxidation method at 1000° C. or higher, or a high temperature CVD method at 900° C. or higher. The process in which to form the first and the second silicon nitride layers by low temperature process is preferably by a room temperature plasma CVD method. The process in which to form a floating gate layer at temperature lower than the high temperature process is capable by the CVD method at 700° C. or lower. In this process, the floating gate layer having fine silicon crystal particles buried in the oxide film is preferably formed by a flow rate control of feedstock gas, and a temperature control of feedstock gas, and/or a temperature control of reactor of the CVD. Also, the other forming method of the floating gate layer is characterized in that, it comprises forming a first silicon oxide layer by CVD method, forming a layer having fine silicon crystal particles buried in a oxide film on the first silicon oxide layer by a flow rate control of feedstock gas, and a temperature control of feedstock gas, and/or a temperature control of reactor of the CVD, forming a second silicon oxide layer on said layer by the CVD, wherein each thickness of said first and said second silicon oxide layers are differed with each other. The forming process of the floating gate layer is also preferably of forming a silicon oxide layer by the CVD, and forming a silicon nitride layer on said silicon oxide layer by the CVD.

The process to form the cavity by removing the first and second silicon nitride layer from the structure etched into the shape of gate insulation film may be of etching them from the exposed side surfaces of silicon nitride layer of the structure with hydrofluoric acid, and the process to anneal the structure and to deflect the floating gate may be of annealing at 300° C. or lower.

According to the above method of manufacturing, the gate insulation film that has a cavity, and has a floating gate layer in the cavity having two stable deflection states, the stable states deflecting toward the channel side and toward the gate side of a transistor can be formed. This formation mechanism is assumed as below. That is, before the annealing, the first and the second silicon oxide layers constituting the insulation film have a structure stable at the high process temperature of the high temperature forming process, namely, the structure expanded from the stable structure at the annealing temperature having built-in stress in the structure. And also similarly, before the annealing, the silicon oxide layer constituting a floating gate has the structure stable at the process temperature of the forming process, namely, the structure expanded from the stable structure at the annealing temperature having built-in stress in the structure, but since the process temperature for the forming is lower than that of the first and the second silicon oxide layers, the extent of expansion of the structure is smaller than that of the first and the second silicon oxide layers.

Upon annealing the structure comprising the first and the second silicon oxide layers and the silicon oxide layer which constitutes the floating gate, the built-in stresses of those layers are released and the structures of those layers shrink to be changed to the structure stable at the annealing temperature, then, since the extent of expansion of the first and the second silicon oxide layers has been larger than that of the silicon oxide layer constituting the floating gate, the first and the second silicon oxide layers shrink more greatly. Accordingly it is assumed that, since the floating gate must become longer than the first and the second silicon oxide layers, the floating gate must be deflected inside the cavity.

And another assumption may be possible as follows. Upon generating the thermal expansion of floating gate layer by the annealing, since the thermal expansion coefficient of silicon oxide is positive, the floating gate layer expands sufficiently as a volume relaxation by the thermal treating and the influence of the space of cavity. And since the expansion in the direction of film thickness is small enough, the floating gate layer may extend effectively in the direction of channel length. In this case, since the volume of the gate insulation film holding the floating gate layer and the substrate holding the gate insulation film are relatively or sufficiently large, the expansion of those are negligible compared to the expansion of the floating gate layer, and therefore the double stable states of the floating gate layer which are advantageous in elastic energy may be generated.

Further, a memory array according to the present invention is characterized in that, it uses the information memory device described above as a memory cell. In the memory array of such makeup, since information can be written and read by mechanical operation of the floating gate, the device is not deteriorated by leak current, and is of high speed and high reliability memory.

BRIEF DESCRIPTION OF THE DRAWINGS

The present invention will better be understood from the following detailed description and the drawings attached hereto showing certain illustrative forms of embodiment of the present invention. In this connection, it should be noted that such forms of embodiment illustrated in the accompanying drawings hereof are intended in no way to specify or limit the present invention but to facilitate an explanation and an understanding thereof.

BEST MODES FOR CARRYING OUT THE INVENTION

Hereinafter, the appropriate embodiments of the present invention will be described in detail with reference to the drawing figures using same marks and symbols for practically identical or corresponding parts. In the present embodiment, although accumulated carriers are assumed to be positive holes, entirely same description is possible even for the case in which accumulated carriers are electrons, by exchanging on and off states. Also in the present embodiment, although the floating gate layer is described as fixed at its both ends likely so-called supported beam, same description is possible even for the case in which the floating gate layer is fixed at its single end likely so-called cantilever.

First of all, the first embodiment of an information memory device of the present invention is explained.

Figure 1:
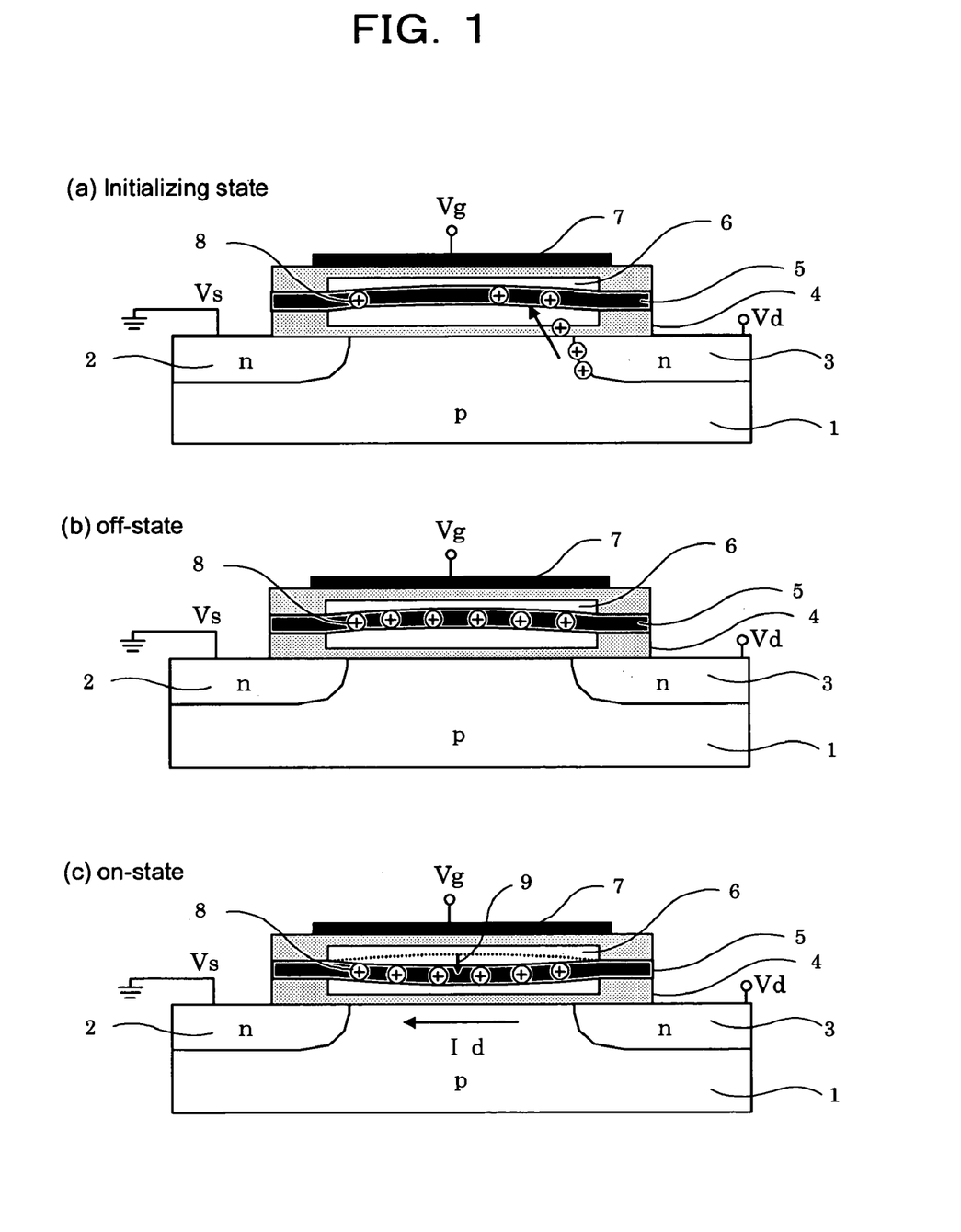
FIG. 1 is a cross-sectional view of the information memory device in accordance with the first embodiment of the present invention, and (a) shows initialization, (b) off-state, and (c) on-state.

FIG. 1 is a cross-sectional view of an information memory device in accordance with the first embodiment of the present invention. In order to explain the principle of operation, initializing state 1 (a), off-state (b), and on-state (c) are respectively indicated.

The information memory device of the present invention has a source, a drain, and a gate on a semiconductor substrate, and the gate insulation film of gate has a floating gate therein, and the floating gate is held in a space of the gate insulation film. For more definitely, referring to FIG. 1(a), n-type source 2 and drain 3 are formed on p-type silicon substrate 1, and on the surface, gate insulation film 4 made of silicon oxide ($SiO_2$) is formed, and floating gate layer 5 are formed nearby the middle part of thicness of gate insulation film 4. Floating gate layer 5 is made of silicon oxide containing fine silicon crystal particles (diameter 10 to 100 nm), and the fine silicon crystal particles can accumulate carriers such as electrons or positive holes. In the present embodiment, although the silicon oxide containing fine silicon crystal particles is described for an example, a laminated structure which can accumulate carriers as will be described in the later embodiments can be used.

The circumference of Floating gate layer 5 (excluding the fixed portion) is cavity 6 (filled with air or nitrogen gas) as indicated in the figure as upper-space and lower-space of the Floating gate layer, which is a space made between Floating gate layer 5 and gate insulation film 4. The length of floating gate layer 5 along the surface, directing toward a channel length of the transistor, is made a little longer than the channel length (0.1 to 1 μm). By this makeup, double stable states are possible, wherein the elastic energy of floating gate layer becomes more favorable by the floating gate layer deflecting a little toward up or down.

For example, if downward force is applied to floating gate layer 5 deflecting in cavity 6 toward gate 7 side, that is, deflecting upward convexity as shown in the figure, and when the force exceeds a certain value, floating gate layer 5 changes to be deflecting in cavity 6 toward the channel side, that is, deflecting downward concavely as shown in the figure. The change, from the deflecting downward concavely to the deflecting upward convexly is the reverse thereof. The method of forming the floating gate layer being long in the direction of channel length which is the basis for the mechanical state changing will be described later. On the surface of gate insulation film 4 having the feature mentioned above, gate electrode 7 made of a metal (or polysilicon) is formed to constitute a device.

Next, the explanation of reading and writing of information of the information memory device of the present invention are given. FIG. 1(a) shows the state after initializing which is carried out by only once after forming the device. Assuming Vs as source voltage, Vd as drain voltage, Vg as gate voltage, and Vs=0V, sufficiently high voltage difference (initializing voltage) between Vg and Vd as Vg<<Vd is applied. Accordingly, positive holes 8 are accumulated in floating gate layer 5 by a tunneling current passed through gate insulation film 4 from substrate 1. The accumulated state by positive holes are maintained as far as a voltage which is sufficiently lower than the initializing voltage between Vg and Vd is applied thereafter.

In order to realize off-state (FIG. 1(b)), a voltage difference between Vg and Vd (off voltage: Vg<Vd) is applied, which is lower than the initializing voltage and sufficiently large to change floating gate layer 5 from concavity to convexity. Thereby, floating gate layer 5 becomes convexity state, the average distance between the positive holes 8 accumulated in floating gate layer 5 and the channel is made longer, and the electrostatic field applied to the channel from positive holes 8 is reduced. Due to the reduction of electric field, p-type channel becomes in off-state.

On the other hand, on state is realized by applying a voltage difference between Vg and Vd (on voltage: Vg>Vd) whose direction is reverse to the off voltage, whereby floating gate layer 5 becomes to the concavity state. By the state, floating gate layer 5 approaches to the channel with magnitude of displacement 9, the electric field applied to the channel by positive holes 8 increases to make the channel to be in on state, the current Id arising from voltage difference between Vs and Vd flows, and it becomes possible to function as a memory by reading the current Id.

Figure 2:
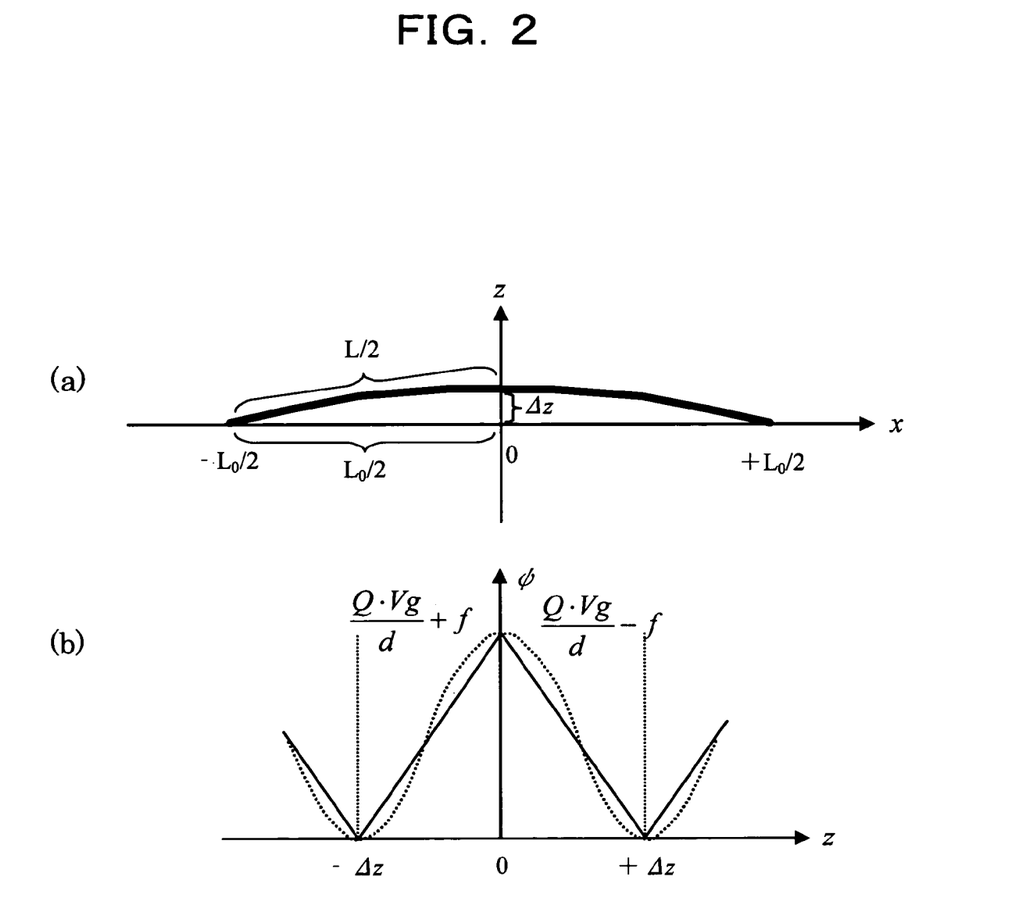
FIG. 2 is a graph for calculation of operating characteristics of the information memory device of the present invention.

Next, the operating speed of information memory of the present invention is explained, referring to FIG. 2. The bold solid line of FIG. 2(a) is the floating gate layer of the present invention representing as one dimensional model. In case that the film thickness of floating gate layer is sufficiently thin, and the change of thickness along depth of the figure (the channel width direction) is negligible, it can be treated by one-dimensional model. The abscissa x shows the channel length direction, and the ordinate z shows the height in vertical direction from the substrate. Assuming $L_0$ as channel length, and L as total length of the floating gate layer, the floating gate layer is shown by the curve in FIG. 2(a) (an example of convexity state). Here, in case that L and $L_0$ are nearly equal, the distance $\Delta z$ between the floating gate layer and x axis is approximately expressed by Equation (1).

$$\Delta z = \frac{1}{2}\sqrt{L^2 - L_0^2} = \frac{1}{2}\sqrt{(L_0 + \kappa L_0 T)^2 - L_0^2} \qquad (1)$$

where T is a temperature, $\kappa$ is the linear expansion coefficient of the floating gate layer, and $\kappa = (1/L_0)(dL_0/dT)$. As mentioned later, the temperature T is adapted with the temperature of thermal treatment of manufacturing process for forming the device.

The mechanical potential energy of the floating gate layer in the convexity state is shown as in FIG. 2(b). At $z = \pm\Delta z$, there exist the stable states which have lowest elastic energy, and displacing from there increases the potential energy because of the energy loss for causing strains. Precisely speaking, nearby $z=0$ and $\pm\Delta z$, it is the harmonic oscillatory potential (shown by dotted line in FIG. 2(b)), but for simplicity, it is approximated by linear potential.

Consideration below makes it possible to estimate the potential height. By applying a force F to the floating gate layer in the direction for decreasing $\Delta z$, the length of the floating gate layer is reduced by the length $\Delta L$. Here the next Equation (2) is realized.

$$\frac{\Delta L}{L_0} = \frac{\kappa L_0 T}{L_0} = \frac{F}{S}\alpha \qquad (2)$$

where $\alpha$ is the coefficient of compressibility per unit area of the floating gate layer, S is the surface area of the floating gate layer (channel length×Channel width).

The potential energy height $\psi$ equals to the product (work) of the distance $\Delta z$ where the floating gate layer moved till becoming straight ($L=L_0$) and the force F applied during it. Therefore, Equation (3) as shown below is realized.

$$\psi = F \cdot \Delta z \qquad (3).$$

While the floating gate layer is pushed by force F, elastic force f operates. Since f corresponds to the slope of potential $\psi$, it is expressed as Equation (4) as shown below.

$$f = \frac{\psi}{\Delta z} = \frac{S}{\alpha}\frac{\Delta L}{L_0} = \frac{S\kappa T}{\alpha}. \qquad (4)$$

The force f operates as reaction force to F while z has a value between $z=+\Delta z$ and $z=0$, and as additional force to F while z has a value between $z=0$ and $z=-\Delta z$. In order to change the floating gate layer from convexity to concavity, electric field is applied to the accumulated charge Q in the floating gate layer by applying a voltage Vg to the gate electrode. Assuming the distance between the gate electrode and the floating gate layer as d, the motion equation of the floating gate layer in this case is expressed as Equations (5) and (6) shown below.

$$\frac{QVg}{d} - f = m\frac{\partial^2 z}{\partial t^2} \quad (z = -\Delta z \text{ to } 0) \qquad (5)$$

$$\frac{QVg}{d} + f = m\frac{\partial^2 z}{\partial t^2} \quad (z = 0 \text{ to } +\Delta z) \qquad (6)$$

wherein m is the total mass of the floating gate layer (excluding the supported part). By solving those motion equation, the time $t_{rw}$ required for the floating gate layer to move from $+\Delta z$ to $-\Delta z$ is obtained as Equation (7).

$$t_{RW} = \sqrt{\frac{2m\Delta z}{\left(\frac{QVg}{d}\right) - \left(\frac{S\kappa T}{\alpha}\right)}} + \sqrt{\frac{2m\Delta z}{\left(\frac{QVg}{d}\right) + \left(\frac{S\kappa T}{\alpha}\right)}} \qquad (7)$$

Figure 3:
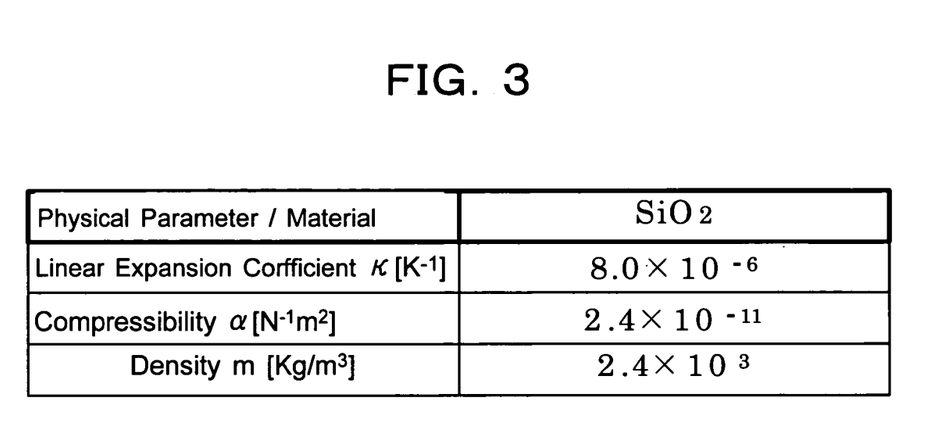
FIG. 3 is a view illustrating physical parameter for calculation of operating speed of the information memory device of the present invention.
Figure 4:
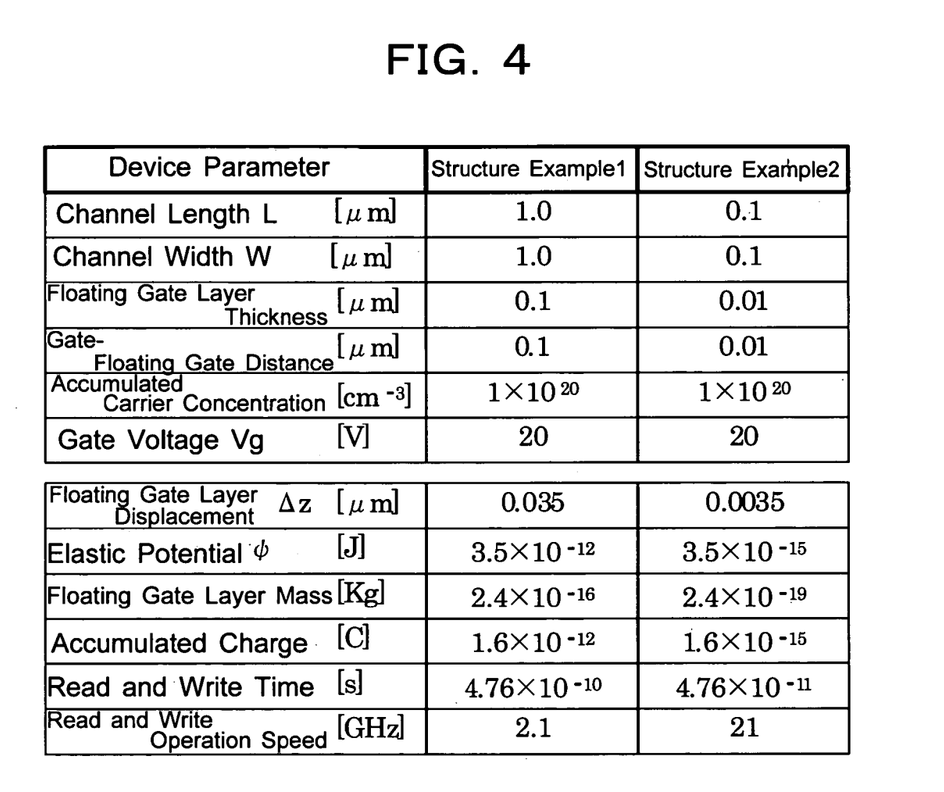
FIG. 4 is a view illustrating operating speed obtained by calculation and device parameter of the information memory device of the present invention.

For a case that silicon oxide is considered as the material for the floating gate layer, physical parameters are as shown in FIG. 3. By using those physical parameters, the device parameters are calculated for two typical cases that the channel length is 1 µm and 0.1 µm, and the results are shown in FIG. 4.

Sufficiently high operating speed can be obtained compared with flash memories of conventional electric memory type, as indicated, the operating speed is 2.1 GHz for channel length 1 µm and 21 GHz for 0.1 µm. Therefore, the information memory device of the present invention, which is a mechanical flash memory, can realize high operating speed without the problem of material deterioration by charging and discharging of electrons.

Figure 5:
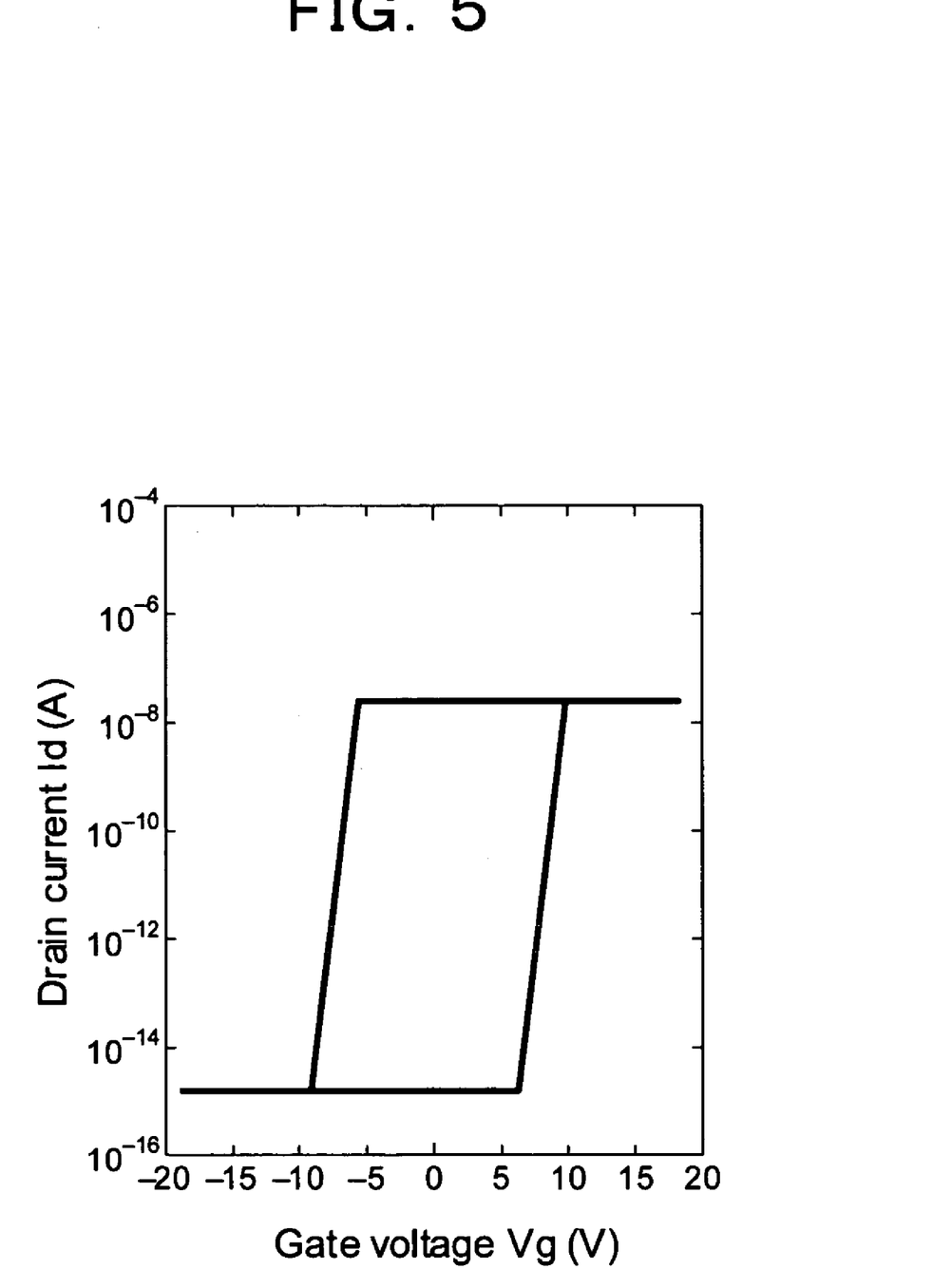
FIG. 5 is a graph illustrating the gate voltage dependency of drain current of the information memory device of the present invention.
Figure 6:
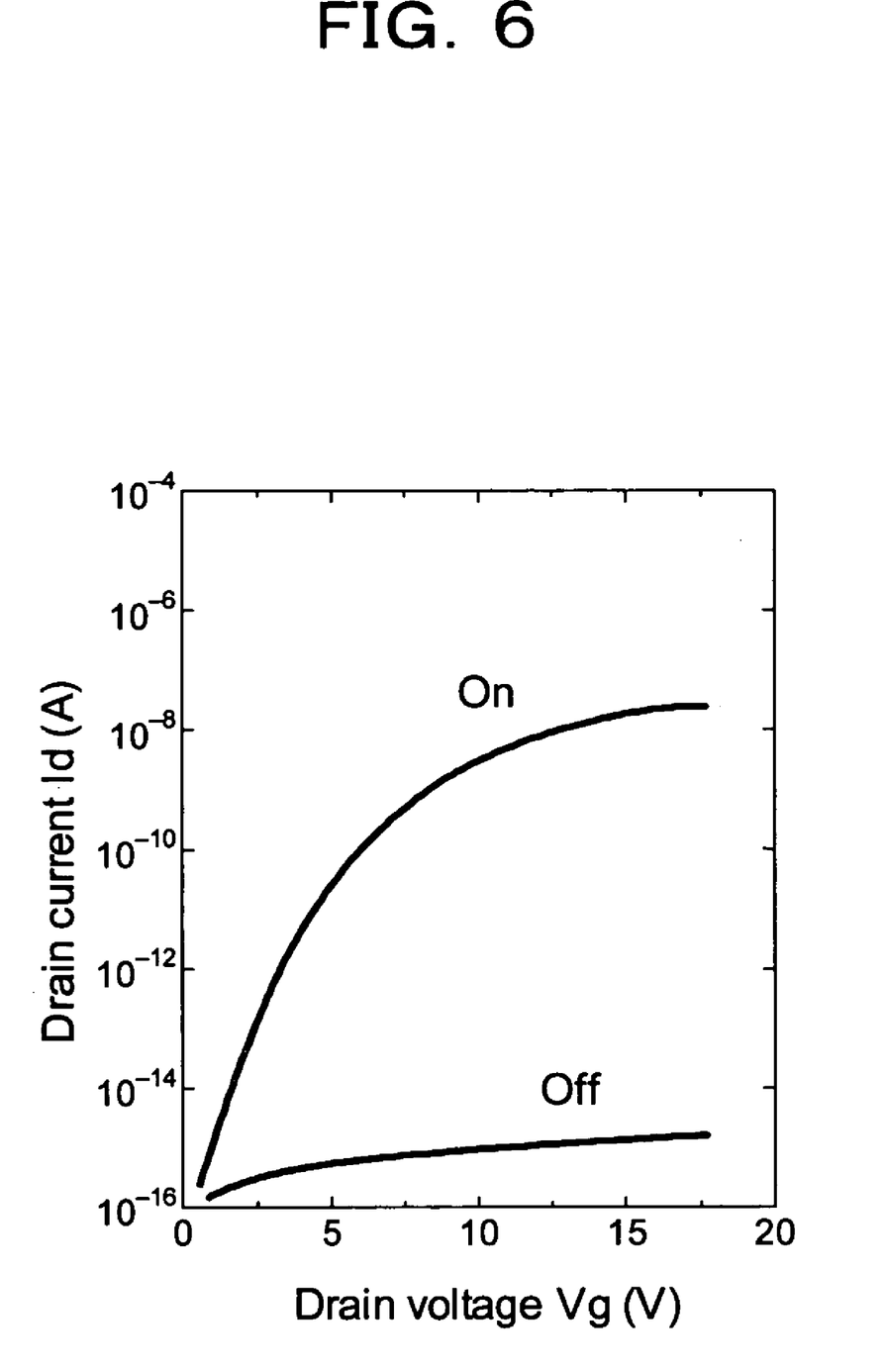
FIG. 6 is a graph illustrating the drain voltage dependency of drain current in on/off states of the information memory device of the present invention.

FIGS. 5 and 6 are graphs showing approximate transportation characteristics of the information memory device of the present invention. FIG. 5 is a graph illustrating the re-writing process of information by gate voltage Vg. First of all, the floating gate layer is assumed to be in convexity, and accumulated with positive holes. Such parameters as device size and others are defined as the same of a structural example 1 of FIG. 4. By applying gate voltage Vg from minus side to plus side, the floating gate layer changes from convexity to concavity at the critical point (about 6V) where the electric field applied to the floating gate layer overcomes the elastic force. Thereby, the channel in off state changes to on state, and drain current Id flows.

Next, by applying Vg from plus to minus side, the floating gate layer changes from concavity to convexity at the reversal critical point (about −6V), and the channel becomes off. Since the current change of this process is a hysteresis curve as shown in FIG. 5, it can operate as a memory with switching voltage Vg about ±20V.

FIG. 6 shows the drain voltage Vd dependency of drain current in on/off states, respectively. Since the channel is not formed in the case of off state, the current Id hardly flows even if applying voltage Vd (leak current is about $1\times10^{-15}$ A), but in the case of on state, since the channel is fully open, large Id flows. Therefore, by measuring the current, the memorized information can be read out.

Figure 7:
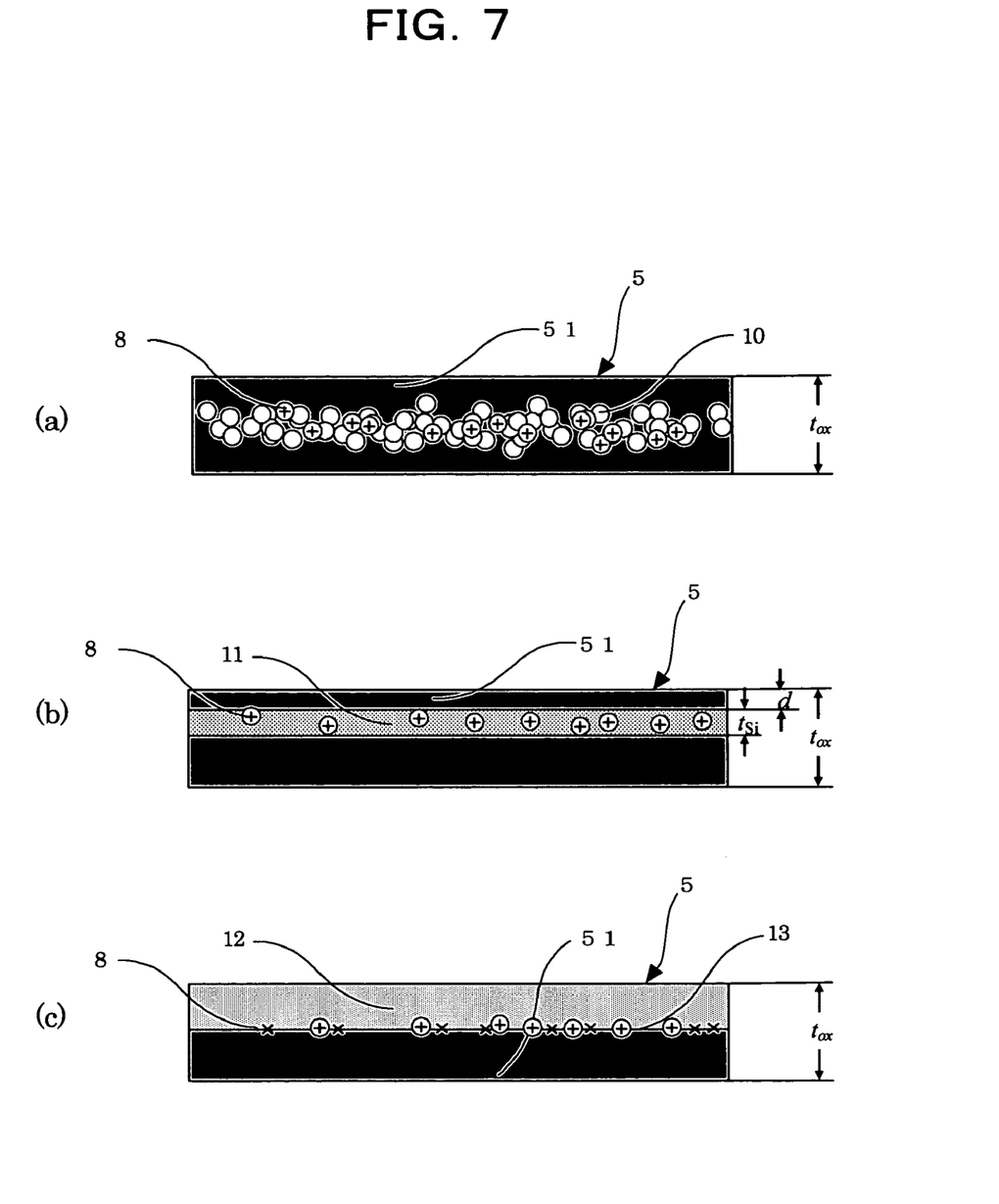
FIG. 7 is a cross-sectional structural view of the floating gate layer of the present invention, and (a) is the structural view of the floating gate in accordance with the first embodiment, (b) is the structural view of the floating gate in accordance with the second embodiment, and (c) is the structural view of the floating gate in accordance with the third embodiment.

The detail of the floating gate layer structure of the present invention is explained next. The floating gate layer having the longer length directing toward the channel, which is the basis of mechanical state change, is formed self-organizingly by using thermal expansion of the conventionally used material such as silicon oxide. The cross-sectional views of the structure are shown in FIGS. 7(a) to (c).

FIG. 7(a) is the floating gate layer in accordance with the first embodiment. The floating gate layer 5 of the first embodiment has the structure in which silicon crystal particles 10 of about 30 to 50 nm diameter are buried in silicon oxide 51. The silicon crystal particles 10 can be relatively easily formed by flow rate control of the feed gas in chemical vapor deposition method (CVD method), or by temperature control of the feed gas or reactors, owing to the recent development of film-making technology. The diameter of the silicon crystal particles 10 is preferably 1 to 50 nm. The CVD can be carried out at substrate temperature of 700° C. or lower.

The silicon crystal particles covered by silicon oxide is formed by forming spherical silicon particles and oxidizing the surface of them in the reactive raw material gas, and then depositing them on a substrate, or by depositing the spherical silicon particles on a substrate without their surface oxidizing and then oxidizing their surfaces by following thermal treatment. The floating gate layer has film thickness $t_{ox}$ of 0.1 to 100 nm, length L of 0.1 to 1 μm, and width of 0.1 to 1 μm, which are corresponding to the channel length and the channel width. The size of floating gate layer is the same in other embodiments.

In the structure thereof, since the silicon crystal which is a semiconductor is isolated in the silicon oxide which is an insulator, electrons (or positive holes 8) transmitted through the silicon oxide by means of a tunneling current are accumulated in the crystal silicon. So far as a voltage which is lager than that of generating the tunneling current is not applied, the accumulated electrons (or positive holes 8) are accumulated semi-permanently in the crystal silicon, therefore this structure is optimal for the floating gate layer of the present invention.

FIG. 7(b) shows a cross-sectional structure of the floating gate layer in accordance with the second embodiment. The floating gate layer 5 of the second embodiment has a structure in which a polysilicon thin film layer 11 is inserted between two silicon oxide 51. The preferable thickness $t_{si}$ of the polysilicon thin film layer 11 depends on that of the floating gate layer, but is 1 to 50 nm preferable, which is about the same to the diameter of silicon crystal particles of the first embodiment. In FIG. 7(b), d indicates the film thickness of silicon oxide on the upper side of the polysilicon thin film layer 11, and is formed in different thickness from the thickness of silicon oxide on the bottom side. In this case, anisotropy of the deflection elastic energy with respect to the deflection direction can be attained by the height shifting of the semiconductor thin film from the center of film thickness of the silicon oxide. Thereby, since the elastic constant of the floating gate layer with respect to the deflection direction can be changed, operating speed such as re-writing speed of a memory device and others can be controlled.

FIG. 7(c) is a cross-sectional structure of the floating gate layer in accordance with the third embodiment. This has the structure of lamination with two kinds of insulators, silicon oxide film 51 and silicon nitride film 12. With such a structure, since the process of manufacturing is simplified compared with other cases, the cost can be reduced. In this case, the defect 13 on the interface of the two insulation layers accumulates electrons (or positive holes). Here, also in this third embodiment as in the second, the anisotropy of elastic energy can be attained by shifting the interface position of insulation layers upward or downward.

Figure 8:
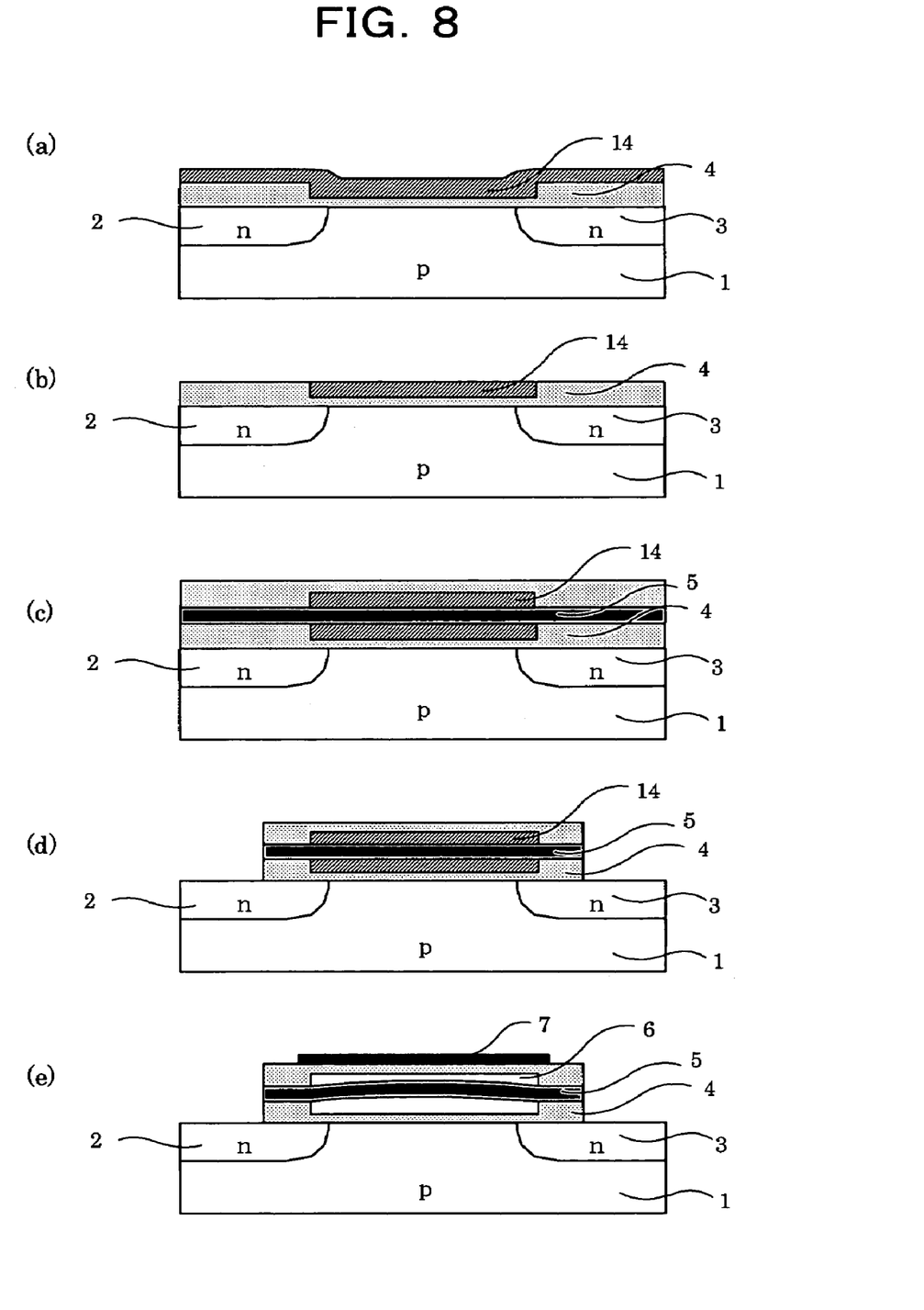
FIG. 8 is a outline diagram illustrating the method of manufacturing the information memory device of the present invention.

The method of manufacturing the information memory device according to the present invention is explained next. FIG. 8 shows a process outline indicating the method of manufacturing an information memory device of the present invention. First of all, referring to FIG. 8(a), n-type impurity is introduced in the surface of p-type silicon substrate 1 by ion implantation or thermal diffusion, thereby n-type source 2 and drain 3 are formed. Silicon oxide film 4 is formed thereon by thermal oxidation or high temperature CVD method and then by patterning so that the film on the upper part of channel is made thinner. The thermal oxidation temperature is 1000° C. or higher, and the high temperature CVD method temperature is 900° C. or higher. Further thereon, at low substrate temperature, for example, at room temperature or so, silicon nitride layer 14 is deposited by plasma CVD method.

Next, referring to FIG. 8(b), the surface of silicon nitride layer 14 is polished by CMP (mechano-chemical polishing method), and flattened so the silicon oxide film 4 is exposed. Further referring to FIG. 8(c), the floating gate layer 5 is deposited on the polished surface by CVD method. In case of the first embodiment of the present invention, the floating gate layer 5 has the structure shown in FIG. 7(a). Silicon nitride layer 14 is formed on the floating gate layer 5 by plasma CVD method and is patterned so as only the part corresponding to the channel part left. Further thereon, silicon oxide 4 is deposited by high temperature CVD method.

Next, referring to FIG. 8(d), silicon oxide film 4 and floating gate layer 5 are patterned so as only the part corresponding to the channel part left. Then, the cross-section as shown in FIG. 8(d) is exposed, where only the part surrounding the channel is left (similarly for the other cross-section).

Finally, referring to FIG. 8(e), the patterned substrate is soaked in, for example, HF (hydrofluoric acid) aqueous solution, and only silicon nitride layer 14 is selectively etched, thereby cavity 6 is formed on and under the floating gate layer 5. Then, since silicon nitride layer 14 is formed at low temperature by plasma CVD method, it contains many vacancy, hydrogen bonds, and defect. Therefore, even by wet etching with hydrofluoric acid, the silicon nitride layer is etched faster than the silicon oxide layers existing on and under the floating gate layer 5. Thereby, substantially only the silicon nitride layer can be selectively removed.

Thereafter, using an annealing oven, the whole substrate is annealed at about 300° C. Before the annealing, the structure of first and second silicon oxide layers 4 constituting insulation film, which is stable at the forming temperature of the high temperature process, are expanded with built-in stress from the structure which is stable at the annealing temperature. Similarly, the structure of silicon oxide layer constituting the floating gate 5, which is stable at the forming temperature of the process, is expanded with built-in stress from the structure which is stable at the annealing temperature, but, since the forming temperature of this process is lower than the forming temperature of the first and the second silicon oxide layers 4, the extent of expansion is smaller than that of the first and the second silicon oxide layers. When annealing the structure comprising the first and the second silicon oxide layers 4 and the silicon oxide layer which constitutes the floating gate 5, the built-in stresses of those layers are released and the structures of those layers shrink to be changed to the structure stable at the annealing temperature, then, since the extent of expansion of the first and the second silicon oxide layers 4 has been larger than that of the silicon oxide layer constituting the floating gate 5, the first and the second silicon oxide layers shrink more greatly. Accordingly it is assumed that, since the floating gate must become longer than the first and the second silicon oxide layers 4, the floating gate 5 must be deflected inside the cavity 6.

And another assumption may be possible. Since the thermal expansion coefficient of silicon oxide is positive, the floating gate layer expands sufficiently as volume relaxation by the thermal treating and the influence of the space of cavity 6. And, since the floating gate layer has several 10 nm of thickness against 0.1 to 1 μm of the length directing toward the channel length, the expansion in the direction of film thickness is small enough, and the floating gate layer extends effectively in the direction of channel length. In this case, since the volume of the gate insulation film 4 holding the floating gate layer 5 and the substrate 1 holding the gate insulation film are relatively sufficiently large, the expansion of those are negligible compared to the expansion of the floating gate layer, and therefore the double stable states of the floating gate layer which are advantageous in elastic energy may be generated.

Figure 9:
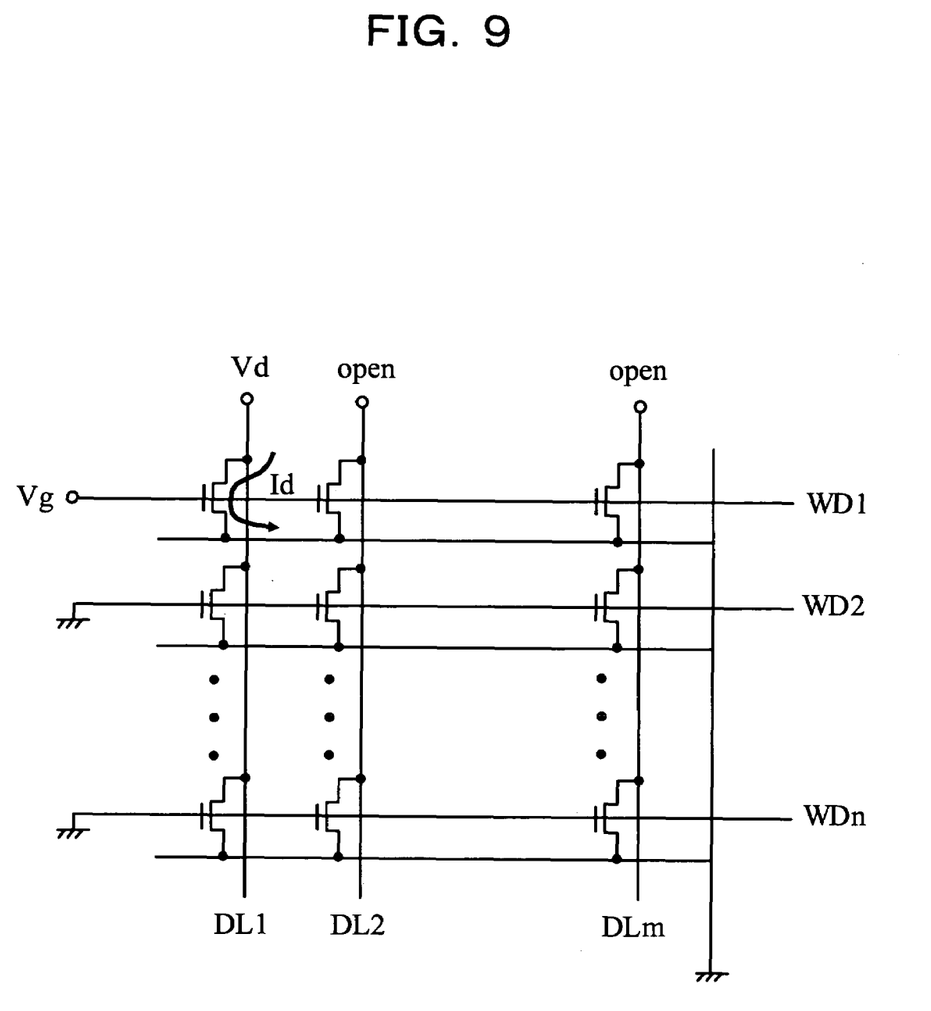
FIG. 9 is a view illustrating the memory array using the information memory device of the present invention.

The information memory device of the present embodiment thus constituted is used as a memory cell, and these memory cells, namely, these transistors are connected into an array, as illustrated, for example, in FIG. 9, such as that, each of the pluralities of gates of transistors aligned in the row are connected in common to each word line WD1 to WDn, each of the pluralities of drains of transistors aligned in the column are connected in common to each data line DL1 to DLm, and all sources of transistors are connected to the common source line SL, respectively. In this way, the memory array according to the present invention is formed by aligning the information memory device of the present invention.

Figure 10:
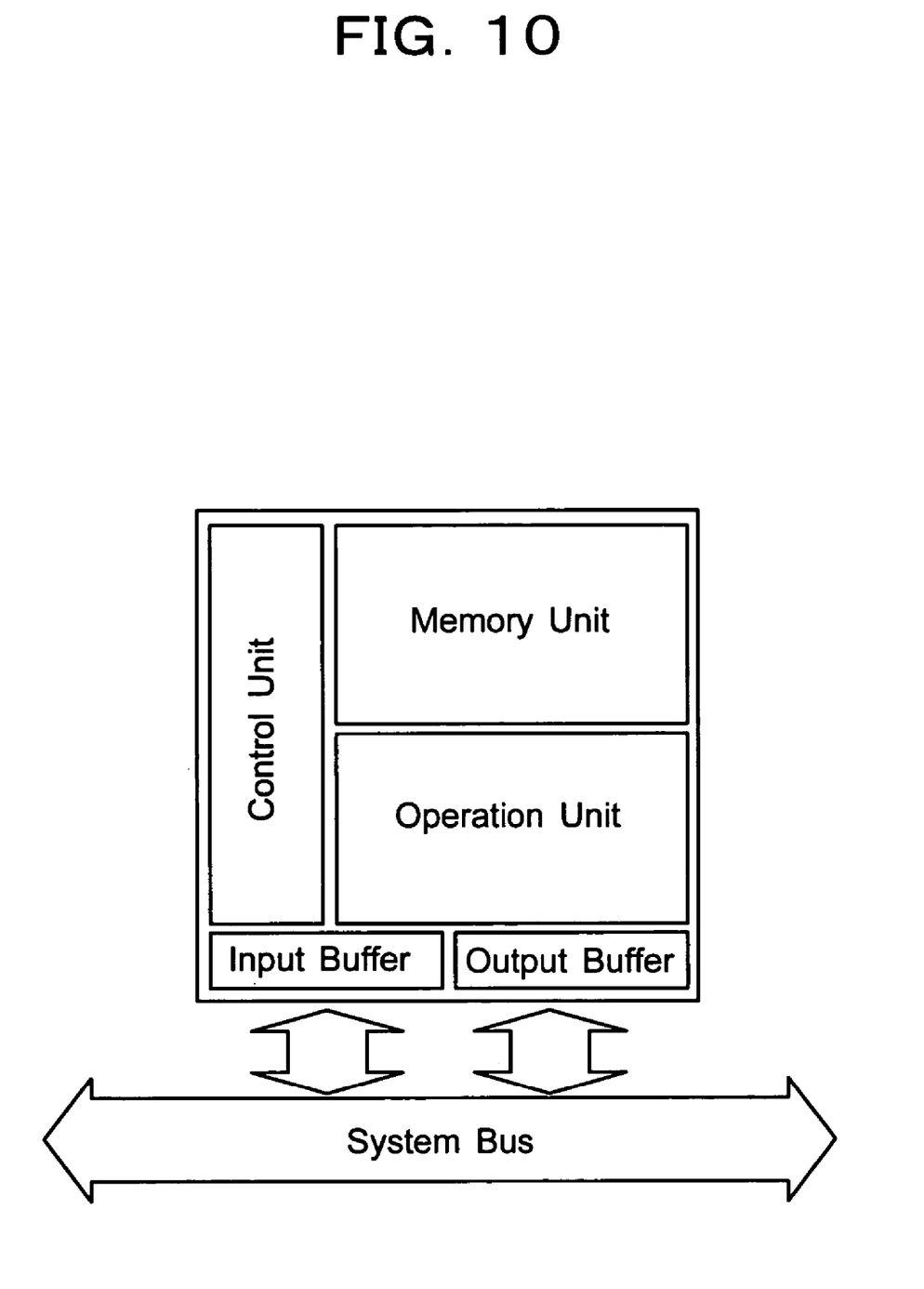
FIG. 10 is a block diagram of an information processing apparatus using the memory array of the present invention.

A block diagram of a microcomputer building in the memory cell of the present invention is shown in FIG. 10. Inside a microcomputer which is connected to system-bus through an input buffer and an output buffer, a memory unit is constituted near a central processing unit. By building in the memory cell of the present invention to the memory unit, the microcomputer of high speed and high reliability can be formed.

INDUSTRIAL APPLICABILITY

As is understood from the above-described explanation, the information memory device of the present invention has the effect that it can write information not by charging or discharging of electrons to the floating gate, but by externally applying the voltage to the electrons (or holes) accumulated in the floating gate layer to cause the change of mechanical state of the floating gate layer, and has the effect that it can read information by the channel current which is changed by the change of mechanical state of the floating gate layer. In using the mechanical state change, since charging or discharging of electrons (or positive holes) to the floating gate may be done only by once after device formation, and reading and writing thereafter may be done only by the mechanical operation of the floating gate layer without charging or discharging of electrons, the problem of device deterioration which occurred in conventional flash memories can be solved.

Further, the method of manufacturing the information memory device of the present invention in accordance with the present invention has the effect that it can manufacture the floating gate existing in the space of the gate insulation film, which has the elastic double stable state.

Also, the memory array in accordance with the present invention has the effect that it is a memory having a high operating speed and high reliability, because reading and writing of information can be done by mechanical motion of the floating gate, which can not cause the deterioration due to the electric current.

What is claimed is:

1. An information memory device having a semiconductor transistor which is provided with a semiconductor substrate, a source, a drain, a gate, and a gate insulation film, characterized in that, said gate insulation film has a cavity, and in this cavity, there exists a floating gate having two stable deflection states, one of which is a stable state deflecting toward a channel side of said transistor, and the other of which is a stable state deflecting toward said gate side, wherein information is memorized by said two stable deflection states of said floating gate layer.

2. An information memory device as set forth in claim 1, characterized in that, said gate insulation film is made of silicon oxide.

3. An information memory device as set forth in claim 1, characterized in that, said floating gate layer is a silicon oxide layer containing silicon crystal particles.

4. An information memory device as set forth in claim 1, characterized in that, said floating gate layer has a structure that a polysilicon thin film layer is sandwiched with two silicon oxide layers.

5. An information memory device as set forth in claim 4, characterized in that, said two silicon oxide layers sandwiching said polysilicon thin film layer have different film thicknesses each other.

6. An information memory device as set forth in claim 1, characterized in that, said floating gate layer has a structure that a silicon nitride layer is laminated on a silicon oxide layer.

7. A method of manufacturing an information memory device having a semiconductor transistor which is provided with a semiconductor substrate, a source, a drain, a gate, and a gate insulation film, wherein said gate insulation film has a cavity, and in this cavity, there exists a floating gate having two stable deflection states, one of which is a stable state deflecting toward a channel side of said transistor, and the other of which is a stable state deflecting toward the gate side, characterized in that, the method of manufacturing said gate insulation film comprises the steps of:

forming a first silicon oxide layer on the semiconductor substrate by high temperature process;

forming a caving region for the cavity at the region corresponding to a channel of the transistor by etching said first silicon oxide layer;

leaving a silicon nitride layer in said caving region by forming a first silicon nitride layer on said surface and etching said silicon nitride layer;

forming a floating gate layer by low temperature process the temperature of which is lower than the temperature of said high temperature process;

leaving a silicon nitride layer on the region corresponding to said cavity region by forming a second silicon nitride layer on said surface and etching said second silicon nitride layer;

forming a second silicon oxide layer on said surface by said high temperature process and etching a multi layer structure comprising said second silicon oxide layer, said floating gate layer, and said first silicon oxide layer into a shape of a gate insulation film;

forming said cavity by removing said first and second silicon nitride layer from said structure etched into the shape of gate insulation film; and deflecting said floating gate by annealing said structure.

8. A method of manufacturing an information memory device as set forth in claim 7, characterized in that, said step of forming the first silicon oxide layer by the high temperature process comprises either a thermal oxidation method at 1000° C. or higher, or a high temperature CVD method at 900° C. or higher.

9. A method of manufacturing an information memory device as set forth in claim 7, characterized in that, said step of forming the first and the second silicon nitride layers by the low temperature process comprises a room temperature plasma CVD method.

10. A method of manufacturing an information memory device as set forth in claim 7, characterized in that, said step of forming the floating gate layer at the temperature lower than said high temperature process comprises a CVD method at 700° C. or lower.

11. A method of manufacturing an information memory device as set forth in claim 10, characterized in that, said step of forming the floating gate layer by a CVD method at 700° C. or lower comprises forming a floating gate layer having fine silicon crystal particles buried in the oxide film by controlling a flow rate of feedstock gas, and a temperature of feedstock gas, and/or a temperature of reactor of the CVD.

12. A method of manufacturing an information memory device as set forth in claim 10, characterized in that, said step of forming the floating gate layer by a CVD method at 700° C. or lower comprises the steps of:

forming a first silicon oxide layer;

forming a layer having fine silicon crystal particles buried in a oxide film on the surface of said first silicon oxide layer by controlling a flow rate of feedstock gas, and a temperature control of feedstock gas, and/or a temperature of a reactor of the CVD; and forming a second silicon oxide layer on said surface by the CVD method, wherein the thicknesses of said first silicon oxide layer and said second silicon oxide layer are made different each other.

13. A method of manufacturing an information memory device as set forth in claim 10, characterized in that, said step of forming the floating gate layer by a CVD method at 700° C. or lower comprises forming a silicon oxide layer by the CVD method and forming a silicon nitride layer by the CVD method on the surface of said silicon oxide layer.

14. A method of manufacturing an information memory device as set forth in claim 7, characterized in that, said step of forming the cavity by removing the first and second silicon nitride layer from the structure comprises removing the first and the second silicon nitride layer by etching from the exposed side surfaces of the silicon nitride layers of the structure with hydrofluoric acid.

15. A method of manufacturing an information memory device as set forth in claim 7, characterized in that, said step of deflecting the floating gate by annealing the structure comprises annealing said structure at 300° C. or lower.

16. A memory array characterized in that, it uses the information memory device as set forth in claim 1 as a memory cell.

* * * * *